United States Patent [19]

Konno et al.

[11] Patent Number: 4,779,020

[45] Date of Patent: Oct. 18, 1988

[54] ULTRASONIC TRANSDUCER

[75] Inventors: Masashi Konno, Yamagata; Takeshi Inoue, Tokyo, both of Japan

[73] Assignee: NEC Corporation, Tokyo, Japan

[21] Appl. No.: 71,098

[22] Filed: Jul. 8, 1987

[30] Foreign Application Priority Data

Jul. 9, 1986 [JP] Japan ................................ 61-162265

[51] Int. Cl.[4] ............................................ H01L 41/08

[52] U.S. Cl. .................................... 310/325; 310/334

[58] Field of Search ............... 310/321, 323, 325, 322, 310/328, 337, 334

[56] References Cited

U.S. PATENT DOCUMENTS

| | | | |
|---|---|---|---|
| 3,110,825 | 11/1963 | Miller | 310/325 |
| 3,230,403 | 1/1966 | Lewis et al. | 310/325 X |
| 3,778,758 | 12/1973 | Carson | 310/325 X |
| 4,225,803 | 9/1980 | Goof | 310/325 X |

*Primary Examiner*—Mark O. Budd
*Attorney, Agent, or Firm*—Helfgott & Karas

[57] ABSTRACT

A front mass and a rear mass are respectively provided at both ends of a piezoelectric vibrator. The piezoelectric vibrator, front mass and rear mass are firmly cramped and are contained in a cylindrical resonator. Either the rear mass or the front mass and the cylindrical resonator are connected by a coupler.

17 Claims, 4 Drawing Sheets

ULTRASONIC TRANSDUCER

BACKGROUND OF THE INVENTION

This invention relates to an ultrasonic transducer, and more particularly to improvements in frequency, efficiency and radiation power characteristics thereof.

Among conventional ultrasonic transducers capable of high-power radiation, well known is the Langevin transducer cramped by bolts (another name: Tonpilz Transducer) which is described in a paper by RALPH S. WOOLLET, entitled "Power Limitations of Sonic Transducers", IEEE Transaction on Sonics and Ultrasonics, October 1968, on page 221.

In this conventional transducer, as shown in FIG. 1, a piezoelectric vibrator (piezoceramic ring) 101 is provided between a front mass 103 and a rear mass 102. These members are firmly cramped together by using a bolt 104 and a nut 105. Although such a transducer is advantageous for high-power radiation because compression bias stress is applied to the piezoelectric vibrator 101 through the bolt and nut, its available frequency bandwidth is narrow, at most 20%, because of its single resonance operation. The characteristic (relationship between the frequency and the relative current) of the transducer operated at a constant voltage in air is shown by broken line in FIG. 2. As shown clearly in FIG. 2, the maximum current flows and the vibrational energy becomes maximum at the resonant frequency $f_0$. In FIG. 3, the broken line illustrates the relationship between frequency and relative transmitting voltage sensitivity $S_s$ of the above transducer used in water. From FIG. 3 it is understandable that the relative transmitting voltage sensitivity $S_s$ also shows its maximum near the resonant frequency $f_0$ and the available bandwidth is narrow when the transducer is used in water. The actual fractional 6 dB bandwidth available is at most approximately 20%.

In another type of ultrasonic transducer, an acoustic matching plate of a quarter wave length with respect to the resonant frequency is provided at the acoustic radiating side of the piezoceramic vibrator. Such a transducer has a wide-band characteristic and high efficiency. (See IEE Proceedings, Vol. 131, Part F, No. 3, pp. 285–297, June 1984). The matching plate has an impedance between the piezoceramic vibrator and the water. The matching of the acoustic impedance with water is achieved at the specific acoustic impedance (defined as a product of sound velocity and density) of $3.2\times10^6$ to $4.5\times10^6$ MSK Rayls. The material of the matching plate having such specific acoustic impedance is usually comprised of a compound material of an epoxy resin and inorganic fine-grain glass which is equally distributed in the epoxy resin. The desired acoustic impedance can be obtained by adjusting the mixture ratio of the inorganic fine grain. The acoustic matching plate and ceramic vibrator is stuck together with epoxy adhesive, and the acoustic matching plate is therefore likely to become separated from the ceramic vibrator. Furthermore, the acoustic matching plate of the material mentioned above tends to cause deterioration in linearity under high power radiation. Therefore, this type of transducer is limited in use for small or medium power radiation and is not suitable for high power radiation (for example: parametic array).

SUMMARY OF THE INVENTION

An object of the present invention is to provide a transducer capable of wide-band operation with high efficiency.

Another object of the present invention is to provide a transudcer capable of high power radiation.

A further object of the present invention is to provide a compact-size transducer.

According to the present invention, a front mass and a rear mass are respectively provided at both ends of a piezoelectric vibrator. The piezoelectic vibrator, front mass and rear mass are firmly cramped and are contained in a cylindrical resonator. Either the rear mass or the front mass and the cylindrical resonator are connected by a coupler.

Other objects and features will be clarified from the following description with reference to the drawings.

PREFERRED EMBODIMENTS OF THE INVENTION

Figure 1:
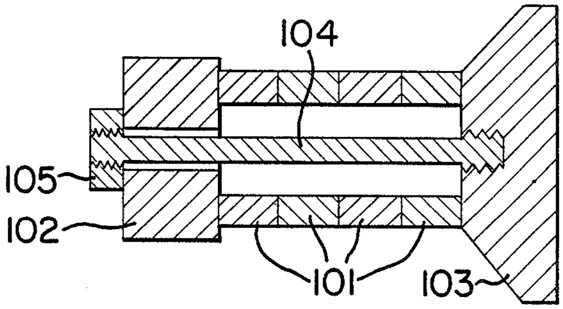
FIG. 1 PRIOR ART
FIG. 1 is a cross sectional view of the conventional bolted transducer.
Figure 4:
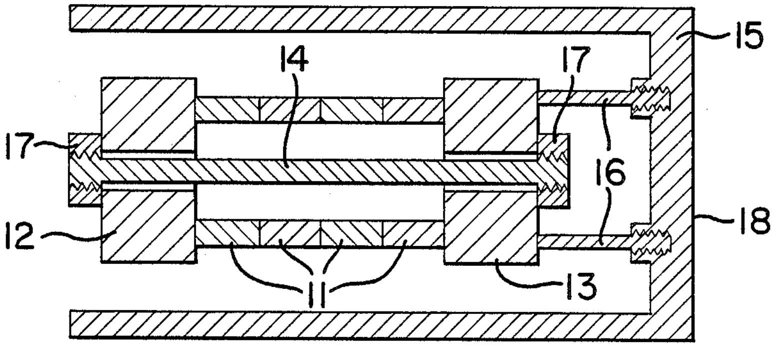
FIG. 4 is a cross sectional view illustrating one embodiment of the transducer according to the present invention.

The basic structure of the ultrasonic transducer according to the present invention is illustrated in FIG. 4, in which reference numeral 11 represents a hollow piezoceramic vibrator, 12 and 13; a rear mass and a front mass, 14; a bolt, 15; a half-wave length mode cylindrical resonator, 16; a vertical coupler, and 17; a nut. The bolt 14 is passed through holes of the rear mass 12 and front mass 13. The statical stress can be biased to the piezoceramic vibrator 11 by means of the bolt 14 and the nut 17.

As is well known, the piezoceramics has much smaller strength to tension than that to pressure, such a bolt cramping (bolted) Langevin vibrator having a means for applying statical compression stress is advantageous for vibrating strongly with high power. The half-wave length mode cylindrical resonator 15 may preferably be made of a metallic alloy such as Al-alloy, Ti-alloy, fiber reinforced plastics (FRP) such as carbon fiber, or a whisker reinforced metal to which SiC whisker or the like because they are light in weight and large strength. The vertical coupler 16 is formed by metal of large strength metal (for example: Cr-Mo steel), and connects the front mass 13 with the resonator 15. A belt and a nut or welding are usable to connect them and the cylindrical resonator 15 with the vertical coupler 16.

Since the transducer according to the present invention whose essential portions are made of high strength metal, fiber or whisker reinforced material, and further any organic adhesive is not necessary for mechanical connection, the great mechanical strength can be obtained than that obtained from the conventional transducer having the matching plates, realizing stable high power acoustic radiation.

The transducer according to the present invention has double resonant modes, that is, in-phase mode (resonant frequency $f_1$) and antiphase mode (resonant frequency $f_2$ higher than $f_1$ the in-phase mode). This transducer, therefore, is called a double mode transducer, on the other hand, the Tonpilz transducer is called a single mode transducer.

Under the in-phase mode the cylindrical resonator 15 extends with the extention of the bolted Langevin vibrator, or the cylindrical resonator 15 contracts with the contraction of the bolted Langevin vibrator. In this case, the vertical coupler 16 is almost free from deformation under the in-phase mode. On the other hand, under the antiphase mode, the cylindrical resonator 15 contracts with the extension of the bolted Langevin vibrator, or the cylindrical resonator 15 extends with the contraction of the bolted Langevin vibrator. In this case, the vertical coupler 16 is deformed by the contraction or extention force. The resonant frequency $f_2$ under the antiphase mode becomes higher than the resonant frequency $f_1$ under the in-phase mode in proportion to the stiffness degree of the vertical coupler 16, resulting in wide-band operation. Therefore, in order to improve the frequency characteristic of the transducer, the vertical coupler 16 must be thicker in diameter, the mechanical strength consequently increases.

Figure 2:
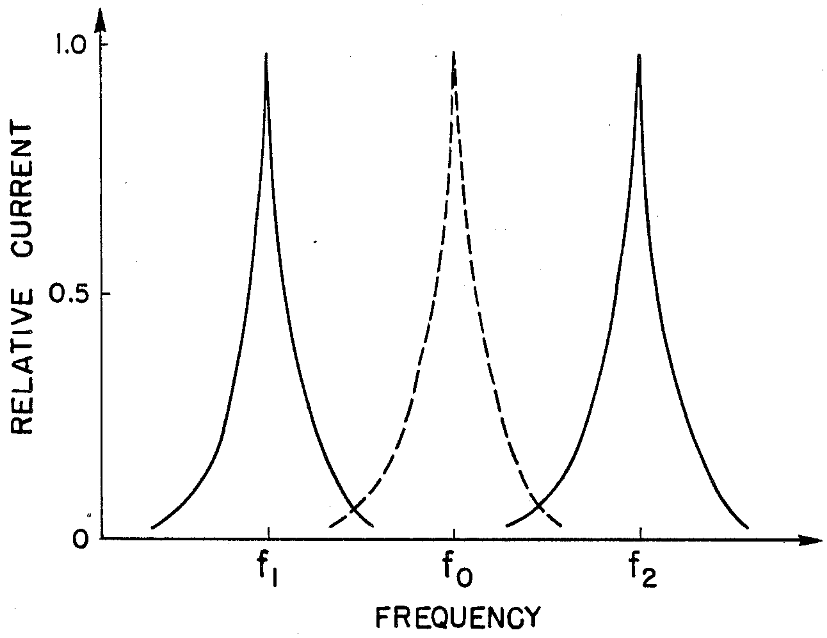
FIGS. 2 and 3 are graphs illustrating frequency characteristics of the conventional transducer and that according to the present invention.
Figure 3:
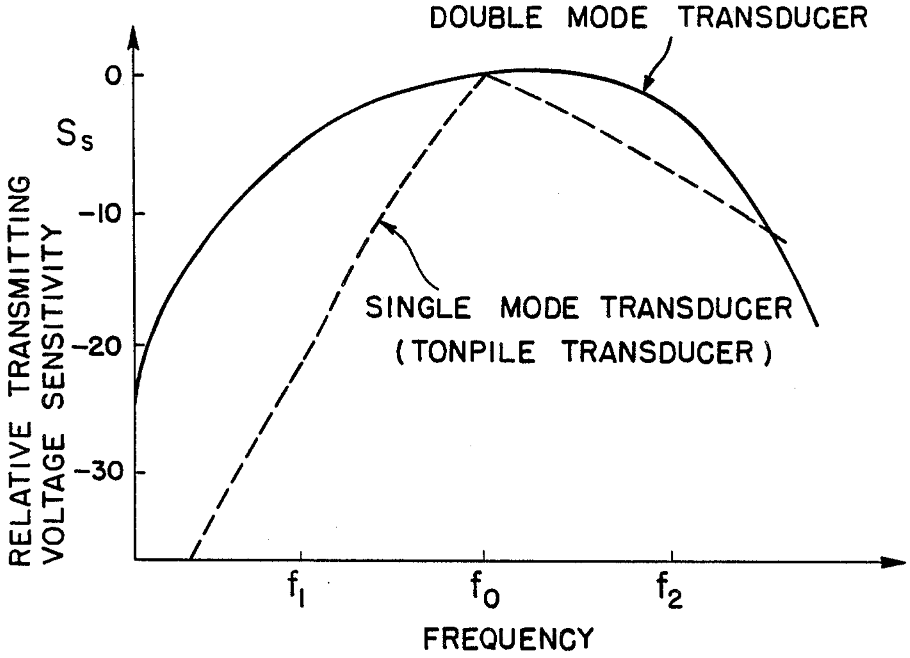

The transducer operated in air shown in FIG. 4 has two resonant frequencies ($f_1$ and $f_2$) and the characteristic as shown in solid line in FIG. 2. Since this transducer used in water is usually set to match with water in impedance at the intermediate point of the above frequencies $f_1$ and $f_2$, that is $(f_1+f_2)/2$, an almost constant sensitivity can be obtained between $f_1$ and $f_2$ as shown with solid line in FIG. 3. Furthermore, the power input into the transducer is capable of being used as the acoustic output without any loss from the acoustic radiating surface because the matching with water in impedance is completely achieved in the frequency range between $f_1$ and $f_2$. Consequently, the transducer according to the present invention has both wide-band and high efficiency characteristics.

The one side end surface 18 of the half-wave length cylindrical resonator 15 is used as an acoustic wave radiating surface. This portion is a critical part for impedance matching with water. The material of a small density is advantageous for the material of the half-wave length resonator 15 in impedance matching with water for the wide-band operation characteristic, therefore, light and strong material such as Ti-alloy, Al-alloy, carbon reinforced plastic, fiber reinforced metal and whisker metal are preferable.

Figure 5:
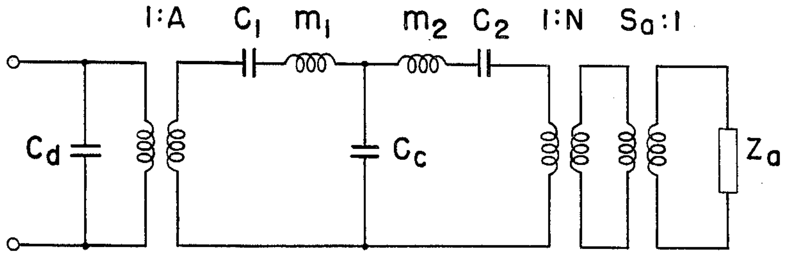
FIG. 5 is a electrically equivalent circuit diagram of the transducer shown in FIG. 4.

The operation and the impedance matching with water of the transducer is understandable from an integrated constant approximated equivalent circuit shown in FIG. 5. In FIG. 5 $C_d$ represents control capacity, A; power factor, $m_1$ and $C_1$; equivalent mass and equivalent compliance of the bolted Langevin vibrator, and $m_2$ and $C_2$; equivalent mass and equivalent compliance of the half-wave length cylindrical resonator viewed from the coupler side. Symbol N represent mechanical ratio of transformation showing the asymmetry degree of the half-wave length resonator, which is defined in accordance with the vibration velocity distribution and the positional relationship between the coupler and the cylindrical resonator. Symbol $S_a$ represents a cross sectional area which radiates acoustic wave, and $Z_a$; an acoustic transmitting impedance of water in the acoustic system.

According to the transducer of the present invention, the transducer in which both the right hand and the left hand resonators with respect to the vertical coupler of a same equivalent mass and resonant frequency can be of course formed ($m_1=m_2$, $C_1=C_2$). Furthermore asymmetric ultrasonic transducer ($m_1\neq m_2$, $C_1\neq C_2$), in which the resonant frequency and equivalent mass are made different between the bolted Langevin vibrator and the half-wave length resonator, can also be formed with a well-known asymmetric parameter method or a transformer filter.

Figure 6:
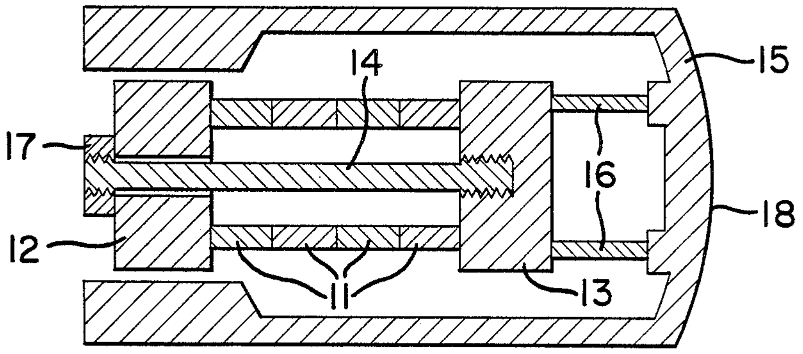
FIG. 6 is a cross sectional view illustrating another embodiment of the present invention.

One embodiment of the transducer according to the present invention is shown in FIG. 6. The ring 11 is made of lead zirconate, tinanate piezoceramic in the longitudinal direction. Adjacent rings are arranged in such a manner the polarizing directions inverts, and these rings are electrically connected in parallel. Metallic masses 12 and 13 are made of stainless steel. The metallic mass 13 is provided with a thread groove for the purpose of applying statical compression bias to the piezoceramic ring in cooperation with Cr-Mo steelbolt 14 and nut 17. The half-wave length cylindrical resonator 15 is made of Al-alloy, and an acoustic radiating surface 18 is formed in the form of a convex so as to restrict bending deformation. The thickness of the rear portion of the cylindrical resonator 15 is made increase in order to shorten the overall length by using the provided step. The coupler 16 is made of Cr-Mo steel and is connected with the cylindrical resonator 15 and the metallic mass 13 by means of a thread groove provided in the resonator 15 and the metallic mass 13.

The transducer according to the present invention employs strong material such as Al-alloy for its half-wave length cylindrical resonator, and has a hollow structure for the purpose of improvement in wide range of acoustic matching with water. Practical mechanical impedance viewed from the acoustic radiating side is made small. Consequently, high power acoustic radiation, 200 dB re 1 $\mu$Pa at 1 meter, can be obtained easily. Wide-band range characteristic over fractional bandwidth 50%, water acoustic matching and high efficiency radiation over 50% of electric acoustic energy conversion radio is achievable.

Figure 7:
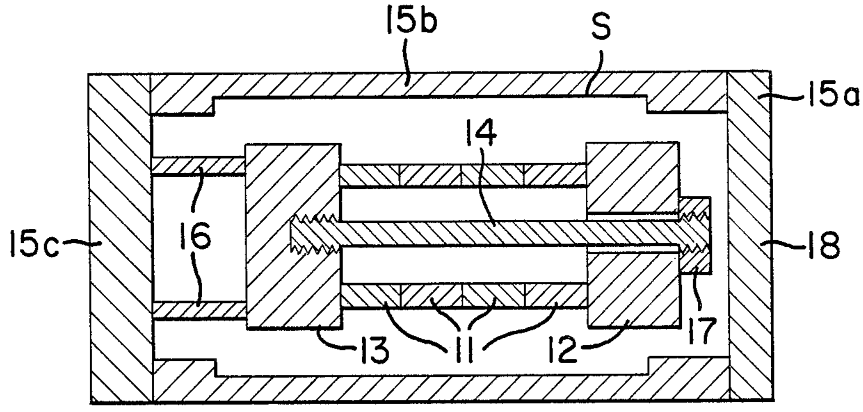
FIG. 7 is a cross sectional view illustrating further embodiment of the present invention.

The other embodiment of the transducer according to the present invention is shown in FIG. 7. Although the components 11, 12, 13, 14 and 17 of the bolted Langevin vibrator are almost the same as the transducer in the embodiment shown in FIG. 6, its longitudinal direction is inverted. The metallic mass 13 and the vertical coupler 16 are made of Cr-Mo steel, and are formed integrally. The half-wave length cylindrical resonator 15 consists of portions **15*a*, 15*b* and 15*c*. The portion 15*a*, which radiates acoustic wave, is made of carbon fiber reinforced plastics (C-FRP) in which carbon fiber is distributed at high density in the form of a satin weave for high rigidity against bending deformation. The portion 15*b* is a cylinder made of Al-alloy, and the portion 15*c* is a rear cover made of stainless steel. The overall length of the half-wave length cylindrical resonator 15 may be shortened by making the step S on the portion 15*b*. That is, the thickness (cross sectional area) at the portion 15*b* is smaller than that of the portions 15*a* and 15*c*. Therefore, the portions 15*a* and 15*c* can serve as mass without vibrating stress. On the other hand, the vibrating stress is concentrated onto the portion 15*b*** having a small cross sectional area like the portion S and the stiffness of the portion 15*b* is also small. Consequently, the portion 15*b* serves as a spring. This mechanical vibration system of the portions 15*a*, 15*b* and 15*c* is like the mass-spring system, therefore, overall length can be shortened in comparison with that of a vertical vibration bar having a constant cross sectional area for one resonant frequency.

The portions 15*a* and 15*b*, and the portsions 15*b* and 15*c* are firmly fastened by means of a bolt. The vertical coupler 16 and the portion 15*c* ae also fastened securely by means of a bolt. Although the portions 15*a*, 15*b* and 15*c* of the half-wave length cylindrical resonator 15 are not integrately formed in this embodiment, the vibration stress is not concentrated because the connected points are positioned near to the side portion of the vibration, as a result of which, a stable high acoustic power can be output. According to the embodiment, wide-band width characteristic, fractional band width over 50%, can be easily obtained due to the low density and high ribidity carbon fiber reinforced plastic used as the acoustic radiating surface 15*a* and Al-alloy used as the cylindrical portion 15*b*.

Figure 8:
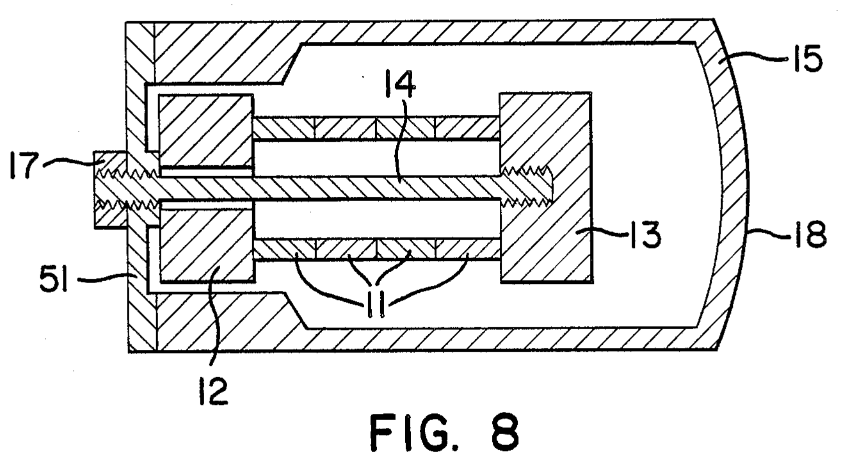
FIG. 8 is a still further embodiment of the present invention.

Another embodiment of the transducer according to the present invention is shown in FIG. 8, in which the bolted Langevin vibrator portion is the same as that of the previous embodiment. In this embodiment, a bending coupler 51 is employed for mechanically coupling the bolted Langevin vibrator and the half-wave length cylindrical resonator in the manner different from the first and second embodiments. Since large bending deformation is applied to the bending coupler 51, the material thereof is preferable to be the material having a large mechanical strength, Cr-Mo steel is, therefore, employed here. Al-alloy is employed in the cylindrical resonator 15.

The cylindrical resonator 15 and the bending coupler 51 are fastened securely by means of a bolt (omitted from illustration). According to the transducer of this embodiment is capable of high power actuation in the similar manner as the previous embodiments, furthermore, the high efficient wide-band range characteristic can be easily achieved.

What is claimed is:

1. A transducer comprising:

a piezoelectric vibrator having first and second opposite ends and a direction of vibration;

a front mass and a rear mass which are provided at the first and second ends respectively of said piezoelectric vibrator in the vibration direction;

a cramping means for cramping said piezoelectric vibrator, said front mass, and said rear mass;

a cylindrical resonator operable under a half-wave length mode and containing said piezoelectric vibrator, said front mass, and said rear mass therein; and a coupler which connects said cylindrical resonator and a selected one of said rear mass and said front mass, thereby making said transducer operate under double resonant modes of in-phase mode and antiphase mode.

2. A transducer according to claim 1, wherein said cramping means is a bolt and a nut.

3. A transducer according to claim 1, wherein said piezoelectric vibrator is a plurality of annular piezoceramics which are stacked.

4. A transducer according to claim 1, wherein said cylindrical resonator is made of Al-alloy, Ti-alloy, a fiber reinforced plastic or a whisker-reinforced metal.

5. A transducer according to claim 1, wherein said coupler is made of Cr-Mo steel.

6. A transducer according to claim 2, wherein said bolt and nut are made of Cr-Mo steel.

7. A transducer according to claim 1, wherein an acoustic radiating surface of said cylindrical resonator has a convex shape.

8. A transducer according to claim 1, wherein said cylindrical resonator in the vibration direction is in part thicker than other portions.

9. A transducer comprising:

a piezoelectric vibrator having first and second opposite ends and a direction of vibration;

a front mass and a rear mass which are provided at the first and second ends respectively of said piezoelectric vibrator in the vibration direction;

a cramping means for cramping said piezoelectric vibrator, said front mass and said rear mass;

a cylindrical resonator operable under a half-wave length mode and containing said piezoelectric vibrator, said front mass, and said rear mass therein, and consisting of rear cover portion, cylindrical portion and acoustic transmitting portion which are connected; and a coupler which connects said rear cover with a selected one of said front mass and said rear mass thereby making said transducer operate under double resonant modes of in-phase mode and antiphase mode.

10. A transducer according to claim 9, wherein portions around the both ends of said cylindrical portion is thicker than other portions.

11. A transducer according to claim 9, wherein said cramping means is a bolt and a nut.

12. A transducer comprising:

a piezoelectric vibrator having first and second opposite ends and a direction of vibration;

a front mass and a rear mass which are provided at the first and second ends respectively of said piezoelectric vibrator in the vibration direction;

a cramping means for cramping said piezoelectric vibrator, said front mass and said rear mass;

a cylindrical resonator operable under a half-wave length mode and containing said piezoelectric vibrator, said front mass, and said rear mass therein and having an acoustic radiating portion;

a bending coupler for connecting a selected one of said front mass and said rear mass to said acoustic radiating portion, said transducer being caused to operate under double resonant modes of in-phase mode and antiphase mode.

13. A transducer according to claim 12, wherein said bending coupler is made of Cr-Mo steel.

14. A transducer according to claim 12, wherein said cylindrical resonator is made of Al-alloy.

15. A transducer according to claim 12, wherein said cylindrical resonator is thicker in part than other portions.

16. A transducer according to claim 12, wherein said cramping means is a bolt and a nut.

17. A transducer according to claim 1, wherein said coupler connects an acoustic transmitting surface portion of said cylindrical resonator to a selected one said front mass and said rear mass.

* * * * *